(12) United States Patent
Cho et al.

(10) Patent No.: US 6,177,320 B1
(45) Date of Patent: Jan. 23, 2001

(54) METHOD FOR FORMING A SELF ALIGNED CONTACT IN A SEMICONDUCTOR DEVICE

(75) Inventors: Chang-Hyun Cho, Seoul; Hong-Sik Jeong, Kyunggi-do; Jae-Goo Lee, Seoul; Chang-Jin Kang, Kyunggi-do; Sang-Sup Jeong, Kyunggi-do; Chul Jung, Kyunggi-do; Chan-Ouk Jung, Seoul, all of (KR)

(73) Assignee: Samsung Electronics Co., Ltd., Kyungki-do (KR)

( * ) Notice: Under 35 U.S.C. 154(b), the term of this patent shall be extended for 0 days.

(21) Appl. No.: 09/226,961

(22) Filed: Jan. 8, 1999

(30) Foreign Application Priority Data

| Jan. 8, 1998 | (KR) | ................................................. 98-00308 |
| Jan. 8, 1998 | (KR) | ................................................. 98-00309 |
| Aug. 3, 1998 | (KR) | ................................................. 98-31537 |

(51) Int. Cl.[7] ................................................. H01L 21/336
(52) U.S. Cl. ........................... 438/279; 438/300; 438/303
(58) Field of Search ........................... 438/279, 300, 438/303, 50, 197, 697, 692

(56) References Cited

U.S. PATENT DOCUMENTS

| 5,086,227 | * | 2/1992 | Toita et al. ............................. 250/309 |
| 5,194,402 | * | 3/1993 | Ehrfeld et al. ......................... 437/180 |
| 5,706,164 | * | 1/1998 | Jeng ....................................... 438/197 |
| 5,863,837 | * | 1/1999 | Sudo ...................................... 438/692 |
| 5,907,781 | * | 5/1999 | Chen et al. ............................ 438/303 |

FOREIGN PATENT DOCUMENTS 0 797 250 A2   9/1997   (EP) ............................. H01L/21/768

OTHER PUBLICATIONS

Y. Kohyama et al., "A Fully Printable, Self–aligned and Planarized Stacked Capacitor DRAM Cell Technology for 1Gbit DRAM and Beyond", 1997 Symposium on VLSI Technology, Digest of Technical Papers, pp. 17–18, (4 pages).

* cited by examiner

Primary Examiner—John F. Niebling
Assistant Examiner—Walter L. Lindsay, Jr.
(74) Attorney, Agent, or Firm—Skjerven Morrill MacPherson LLP; David T. Millers (57) ABSTRACT

A self aligned contact pad in a semiconductor device and a method for forming the self aligned contact pad are disclosed. A bit line contact pad and a storage node contact pad are simultaneously formed by using a photoresist layer pattern having a T-shaped opening including at least two contact regions. An etch stopping layer is formed over a semiconductor substrate and over a transistor. An interlayer dielectric layer is then formed over the etch stopping layer. Next, the interlayer dielectric layer is planarized to have a planar top surface. A mask pattern having a T-shaped opening is then formed over the interlayer dielectric layer, exposing the active region and a portion of the inactive region. The interlayer dielectric layer and etch stopping layer are sequentially etched to reveal a top surface of the semiconductor substrate using the mask pattern, thereby forming a self aligned contact opening exposing a top surface of the semiconductor substrate. The mask pattern is then removed. A conductive layer is formed in the self aligned contact opening and over the interlayer dielectric layer. The conductive layer and the interlayer dielectric layer are planarization-etched to reveal a top surface of the gate mask, thereby forming at least two contact pads.

30 Claims, 12 Drawing Sheets

Fig. 1

(Prior Art)

METHOD FOR FORMING A SELF ALIGNED CONTACT IN A SEMICONDUCTOR DEVICE

FIELD OF THE INVENTION

The present invention relates to methods for fabricating semiconductor devices and more particularly, to methods for forming self aligned contacts.

BACKGROUND OF THE INVENTION

Recent advancement in semiconductor manufacturing techniques has led to increasingly small design criteria. For example, semiconductor devices such 1-Gbit DRAMs have proceeded to a size where alignment margin can hardly be secured when aligning a contact plug with a semiconductor layer or an interconnect layer underlying the contact plug. For a 1-Gbit DRAM having a design criterion of 0.45 $\mu$m pitch or less, the maximum permissible line space is very small, and the size of the contacts must be 0.15 $\mu$m or less. Because of the small sizes, using the conventional direct contact method to form a bit contact or a contact for a storage nodes is difficult. Accordingly, a manufacturing process that self-aligns the contact plug with a semiconductor layer or an interconnect layer underlying the contact plug is employed for sub-quarter micron semiconductor devices. The resulting self aligned contact (SAC) has the advantages of allowing increased margin for misalignment during photolithography and reducing contact resistance.

However, as the pattern sizes become smaller, the possibility of a short between a contact hole and a gate line increases. The contact hole aspect ratio, defined as contact width over contact height, for a high integration density device, such as a memory device, inevitably becomes high. As a result, an etch stop phenomenon occurs during the contact hole formation.

Figure 1:
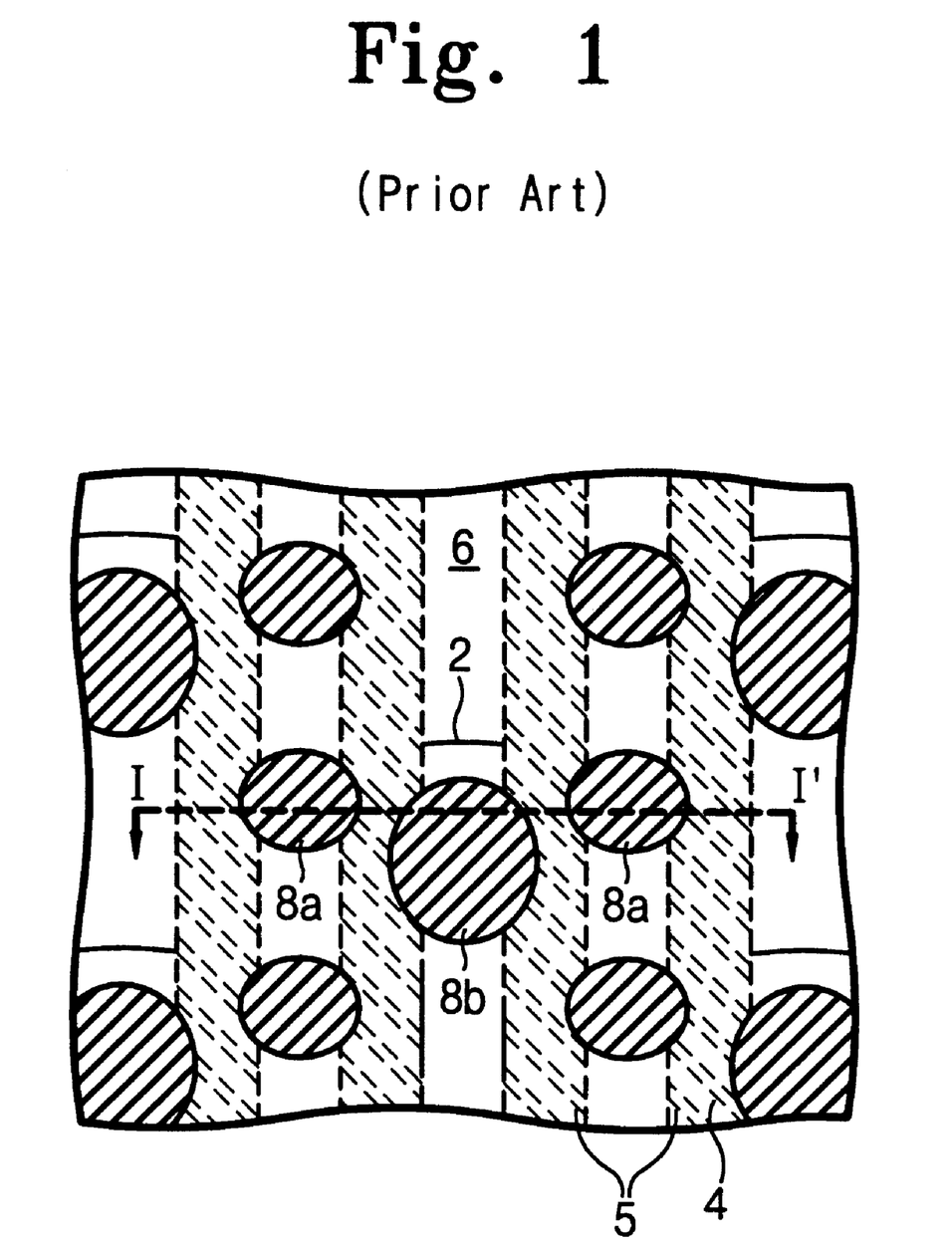
FIG. 1 is a top plan view of a SAC pad structure according to the conventional method.
Figure 2A:
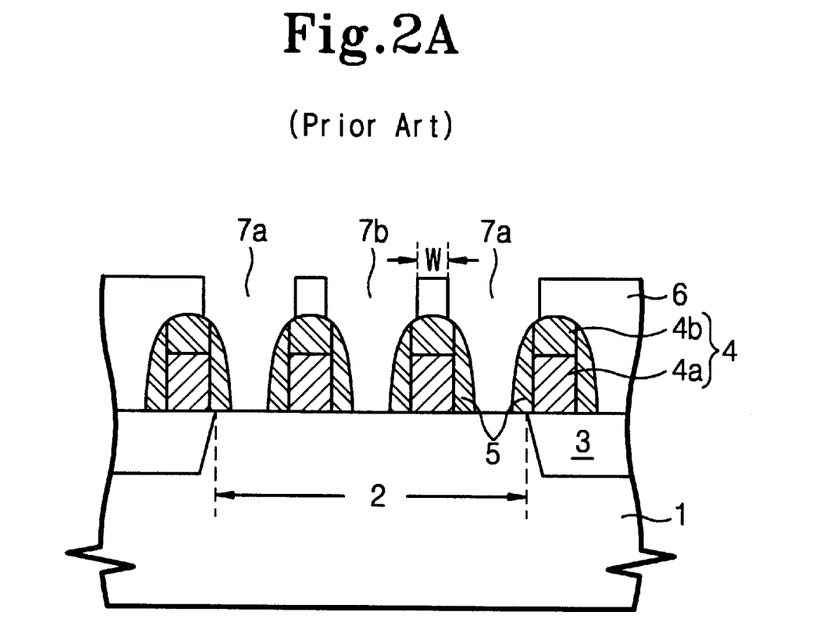
FIG. 2A and FIG. 2B are cross-sectional views taken along line I–I' of FIG. 1, illustrating process steps for forming the self aligned contact.
Figure 2B:
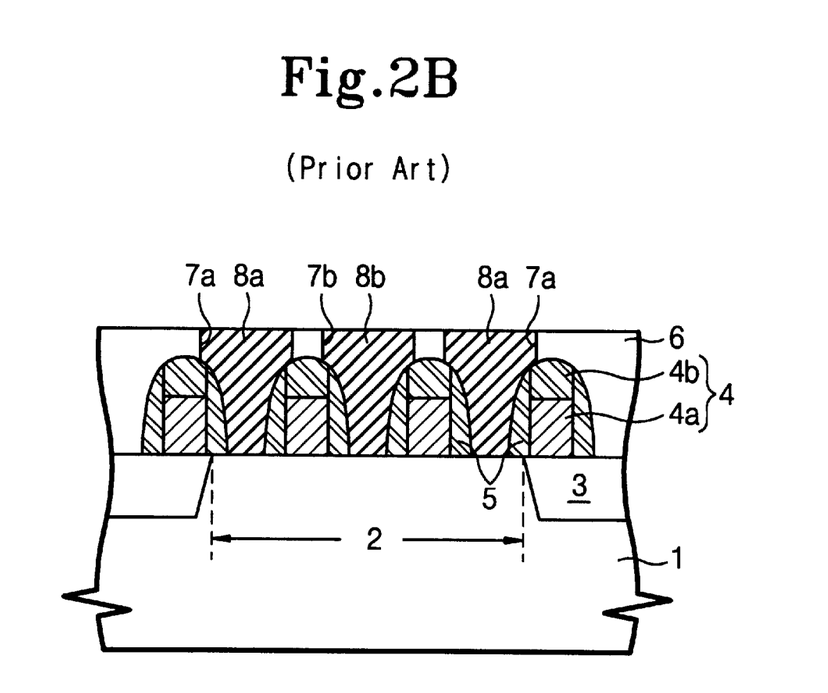

A proposed solution to overcome the etch stop phenomenon uses contact pads. FIG. 1 and FIG. 2 show a conventional method for forming contact holes using SAC pads. FIG. 1 is a top plan view showing an a conventional SAC pad structure, and FIGS. 2A and 2B are cross-sectional views taken along line I–I' of FIG. 1, illustrating process steps for SAC pad formation.

Referring to FIG. 2A, a device isolation region 3 is formed over a semiconductor substrate 1 to define active region 2 and an inactive region. Device isolation region 3 is formed by a suitable method well known in the art, for example, shallow trench isolation (STI) and local oxidation of silicon (LOCOS). A gate oxide layer (not shown) is formed by a conventional method such as thermal oxidation. A gate electrode conductive layer is deposited over the gate oxide layer. A gate mask insulating layer is then formed over the gate electrode conductive layer. The gate electrode conductive layer is generally laminated with polysilicon and tungsten silicide. The gate mask insulating layer is composed of a silicon nitride layer or a silicon oxynitride layer which has an etch selectivity ratio with respect to a subsequent interlayer dielectric layer 6. A gate electrode structure 4 consisting of gate electrode 4a and gate mask layer 4b is formed from the electrode conductive layer and the gate mask layer by conventional photolithography.

Low concentration impurity ions are implanted into active region 2 of semiconductor substrate 1 not covered by gate electrode structure 4, forming a low concentration source/drain region for a LDD (lightly doped drain) structure. Gate spacer 5, which has an etch selectivity ratio with respect to a subsequent interlayer dielectric layer 6, is formed on the sidewalls of gate electrode structure 4. Gate spacer 5 is generally silicon nitride or silicon oxynitride. High concentration impurity ions are then implanted into active region 2 of semiconductor substrate 1 not covered by gate spacer 5 or gate electrode structure 4 to form high concentration source/drain regions. A transistor having LDD structure is thereby formed.

Next, interlayer dielectric layer 6 is deposited over semiconductor substrate 1. A photoresist pattern (not shown) for a self aligned contact is then formed over interlayer dielectric layer 6. Interlayer dielectric layer 6 is then masked and etched using the photoresist pattern, forming contact holes 7a and 7b.

Referring to FIG. 2B, the photoresist pattern is removed, and contact holes 7a and 7b are filled with a conductive material such as polysilicon. The conductive material layer is then planarized using planarization processes well known in the art, such as a CMP (chemical mechanical polishing) and etch-back processes. The planarization process leaves the self aligned storage node contact pad 8a and bit contact pad 8b. For high density devices having a 0.45 $\mu$m pitch or less, performing photolithography to form contact holes 7a and 7b is difficult because contact holes 7a and 7b must be laterally electrically isolated from each other. Thus, interlayer dielectric layer 6 has a very narrow width W, as shown in FIG. 2A.

The self aligned contact pattern for the above described conventional method for forming SAC pad is either circular or elliptical, as shown in FIG. 1. As the device pattern becomes smaller, the area to be etched decreases, and the contact hole aspect ratio increases. As a result, the etching rate falls with the depth of the hole because etching by-products such as polymers cannot easily diffuse out of the contact holes. In severe cases, the etch stop phenomenon occurs where etching by-products in the holes significantly reduce the etching rate or even stop further etching.

To the prevent the etch stop phenomenon, etching must be performed under conditions that suppress by-product formation. In addition, etching time must be increased. However, such etching etches the gate mask layer and sidewall gate spacer and can create a short between the SAC pad and the gate.

Y. Kohyama et al. proposed a method for forming SAC pads in an article entitled "A Fully Printable, Self-aligned and Planarized Stacked Capacitor DRAM Cell Technology for 1-Gbit DRAM and Beyond", Symp. on VLSI Tech., digest of technical papers, pp. 17–18, 1997. The article discloses a gate SAC pattern (which indicates resist area) that is the same as the active area and is shifted by a half pitch in the gate direction. Because the photoresist pattern area is very small, polymer formation is very low during formation of the contact holes. Consequently, the etch selectivity ratio of the interlayer dielectric layer to the nitride layer of the gate spacers and the gate mask layer becomes low. The low selectivity ratio results because polymer formation is proportional to the photoresist pattern area and is inversely proportional to the etching selectivity ratio.

What is needed is a method for forming a self aligned contact in a semiconductor structure that prevents the etch stop phenomenon and has a good etch selectivity ratio during the etching that forms the self-aligned contact openings.

SUMMARY OF THE INVENTION

The present invention provides an improved method for forming a self aligned contact in a semiconductor structure. In accordance with an aspect of the invention, a self aligned contact mask exposes an active region and a portion of an inactive region of a substrate through a T-shaped opening in the mask.

Accordingly, an object of the present invention is to provide a method that prevents the etch stop phenomenon when forming a self aligned contact.

Another object of the invention is to provide a fully printable self aligned contact.

Yet another object of the invention is to provide a method for forming a self aligned contact which provides a good etch selectivity ratio during etching that forms openings for the self aligned contacts. Other aspect, objects, and the several advantages of the present invention will be apparent from a reading of the following disclosure and appended claims.

In accordance with one embodiment of the invention, a method begins by forming gate stacks that are spaced apart from each other over a semiconductor substrate. Each gate stack consists of a gate electrode, a nitride gate mask formed thereon and a nitride sidewall gate spacer. A gate oxide layer is between the gate electrode and the semiconductor substrate. A field oxide layer defines active and inactive regions of the semiconductor substrate. An etch stopping layer for the SAC etch is blanket deposited over the gate stacks and the semiconductor substrate, filling the spaces between the gate stacks and about 100 Å over the gate stacks. The etch stopping layer contains an insulating material such as nitride and has an etch selectivity ratio to the subsequent interlayer dielectric layer made of oxide. The interlayer dielectric layer is deposited over the etch stopping layer to a thickness of about 3000 Å to about 9000 Å or sufficiently to cover the gate stacks. The interlayer dielectric layer is then planarized to improve photolithography process margin. Alternatively, the planarization process first planarizes to reveal top surfaces of the gate stacks, and another interlayer dielectric layer is deposited over the resulting structure to a predetermined thickness.

A mask pattern having a T-shaped opening and preferably made of a photoresist layer, is formed over the planarized interlayer dielectric layer, the opening overlying the active region and a portion of the inactive region. Specifically, the T-shaped opening in the mask pattern overlies the bit line contact region and the storage node contact region. The etch stop phenomenon encountered in conventional methods is prevented because the T-shaped opening in the mask pattern is relatively large compared to openings the conventional methods use. Yet, the T-shaped opening is small compared to that of Y. Kohyama et al. Accordingly, the self aligned contact in accordance with the invention has a good etch selectivity ratio.

The mask pattern is used when etching the interlayer dielectric layer and the etch stopping layer to form self aligned contact openings that expose the top surface of the semiconductor substrate between the gate stacks. After a conventional method removes the mask pattern, a conductive layer, preferably made of polysilicon, is deposited in the self aligned contact opening and over the interlayer dielectric layer to a thickness of about 3000 Å to about 7000 Å. The conductive and interlayer dielectric layers are planarized using a CMP or etch-back process to reveal the top surfaces of the gate stacks. Contact pads, i.e., the bit line contact pad and the storage node contact pad, are thereby formed.

During the etching to form the self aligned contact openings, the gate mask may be lost. Thus, poly stringer formation may occur. Wet or dry etching may be performed on the top surface of the contact pads to remove poly stringers and thereby prevent a bridge between the bit line contact pad and the storage node contact pad. A suitable wet etch may employ SC1(a mixture of $NH_3$, $H_2O_2$, and deionized water), and a dry etch may employ chlorine-based gas.

In another embodiment of the invention, a method begins by forming gate stacks that are spaced apart from each other over a semiconductor. Each gate stack consists of a gate electrode, a nitride gate mask, and nitride sidewall gate spacers. A gate oxide layer is between the gate electrode and the semiconductor substrate, and a field oxide layer defines active and inactive regions of the semiconductor substrate. An etch stopping layer against the SAC etch is blanket deposited over the gate stacks and the semiconductor substrate, filling the spaces between the gate stacks and over the gate stacks to about 100 Å. The etch stopping layer is made of an insulating material such as nitride and has an etch selectivity ratio to the subsequent interlayer dielectric layer that is made of oxide. The interlayer dielectric layer is deposited over the etch stopping layer to a thickness of about 3000 Å to about 9000 Å to sufficiently cover the gate stacks. The interlayer dielectric layer is then planarized to increase photolithography process margins. Alternatively, a planarization process first planarizes to reveal the top surfaces of the gate stacks, and another interlayer dielectric layer is deposited over the resulting structure to a predetermined thickness.

A mask pattern having a T-shaped opening and preferably made of a photoresist layer, is formed over the planarized interlayer dielectric layer with the T-shaped opening overlying the active region and a portion of the inactive region. Specifically, the mask pattern exposes the bit line contact region and the storage node contact region through the T-shaped opening. The etch stop phenomenon encountered in the conventional method is prevented because the T-shaped opening in the mask pattern is relatively large compared to openings the conventional methods use. Yet, the opening is small compared to that of Y. Kohyama et al. Accordingly, the etch selectivity ratio for the self aligned contact is good.

Etching the interlayer dielectric layer using the mask pattern exposes the etch stopping layer between the stack gates. Next, the mask pattern is removed. A nitride layer is deposited over the resulting structure using a method that produces a poor step coverage. Specifically, more nitride is deposited over the interlayer dielectric layer and the top surfaces of the gate stacks than is deposited on the portions between the gate stacks. The nitride layer has a thickness of about 200 Å to about 1500 Å, and PECVD (plasma enhanced chemical vapor deposition) provides this intentionally poor step coverage. The nitride layer compensates for the loss of the gate mask during etching of the etch stopping layer between the gate stacks, minimizing the step between the gate stacks. Next, the nitride layer and the etch stopping layer between the gate stacks are etched back to form a self aligned contact opening. A conductive layer having a thickness of about 3000 Å to about 7000 Å and preferably made of polysilicon is formed in the self aligned contact opening and over the interlayer dielectric layer. Bit line contact pads and storage node contact pads are formed by planarization-etching the conductive layer and the interlayer dielectric layer until the top surfaces of the gate stacks are exposed.

During the etching to form the self aligned contact openings, the gate mask may be lost. Thus, poly stringer formation may occur. Wet or dry etching of the top surface of the contact pads can remove poly stringers and thereby prevent a bridge between the bit line contact pad and the storage node contact pad. Wet etch may employ SC1(a mixture of $NH_3$, $H_2O_2$, and deionized water), and a dry etch may employ chlorine-based gas.

BRIEF DESCRIPTION OF THE DRAWINGS

Use of the same or similar reference symbols in different figures indicates identical or similar items.

DETAILED DESCRIPTION

The preferred embodiment of the present invention will now be described with reference to the accompanying drawings. Corresponding Korean patent applications Ser. No. 1998-308, 1998-309, and 1998-31537 also describe similar embodiments of the inventions.

FIG. 3A to FIG. 3G are top plan views illustrating a process for forming a self aligned contact according to one embodiment of the present invention. FIG. 4A to FIG. 4G are cross-sectional views taken along line II–II' of FIG. 3A to FIG. 3G, respectively, and also illustrate the process for forming the self aligned contact.

Figure 3A:
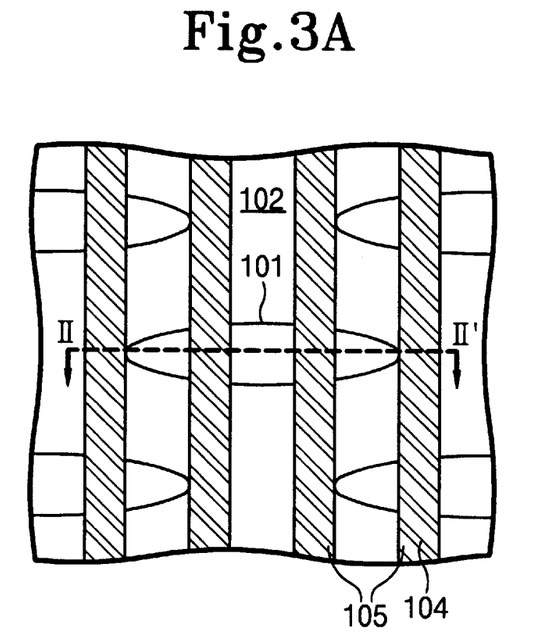
FIG. 3A to FIG. 3G are top plan views illustrating a process for forming a self aligned contact according to one embodiment of the present invention.
Figure 4A:
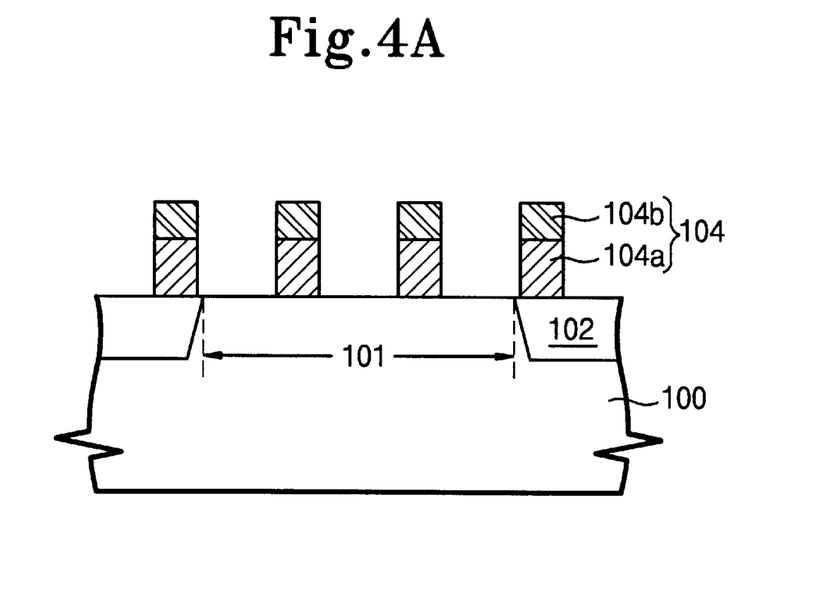
FIG. 4A to FIG. 4G are cross-sectional views taken along line II–II' of FIG. 3A to FIG. 3G, respectively, illustrating process steps for forming the self aligned contact.

Referring to FIG. 3A and FIG. 4A, a device isolation region 102 is formed in an inactive region of a semiconductor substrate 100, e.g., a field oxide layer over semiconductor substrate 100, to define an active region 101. Device isolation region 102 may be formed by a suitable method well known in the art such as, but not limited to, shallow trench isolation (STI) or local oxidation of silicon (LOCOS). Active region 101 has a longitudinal elliptical shape, as shown in FIG. 3A.

A gate oxide layer (not shown) is then formed over semiconductor substrate 100 using a conventional method. Next, a gate electrode conductive layer and then a gate mask insulating layer are deposited over the gate oxide layer. The gate electrode conductive layer is generally, but not limited to a polysilicon layer or laminated polysilicon and silicide layers and has a thickness of about 2000 Å. The gate mask layer is of a material having an etch selectivity ratio to a subsequent interlayer dielectric layer 108. For example, the gate mask layer may be a silicon nitride layer or a silicon oxynitride layer having a thickness of about 1000 Å to about 2000 Å.

A photolithography method well known in the art is conducted on the electrode conductive layer and the gate mask layer to form gate electrode structure lines 104. Each gate electrode structure line 104 consists of a gate mask layer 104b and a gate electrode 104a. A pass gate has a curved part along the edge of active region 101 to allow more space between the gates. The increased space between the gates increases the process margin of the self aligned contact etch and decreases the possibility of the contact not being exposed through the self aligned contact opening created by a subsequent etching.

Next, low concentration impurity ions are implanted into portions of region 101 in semiconductor substrate 100 not covered by gate electrode structures 104 to form a low concentration source/drain region for an LDD (lightly doped drain) structure.

Figure 3B:
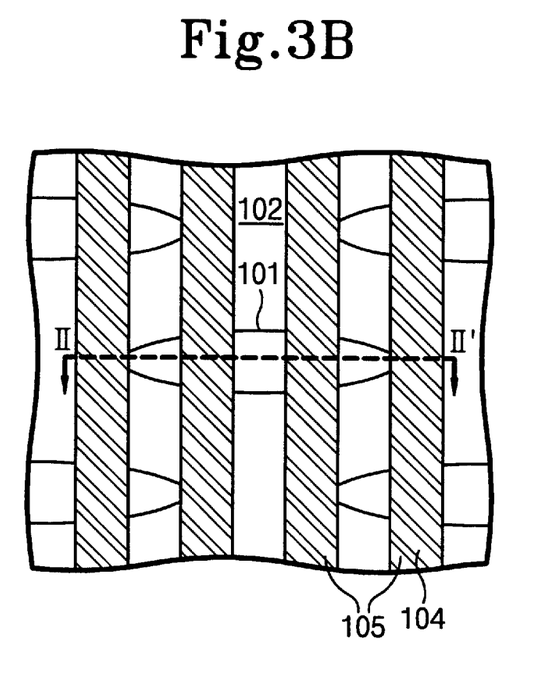
Figure 4B:
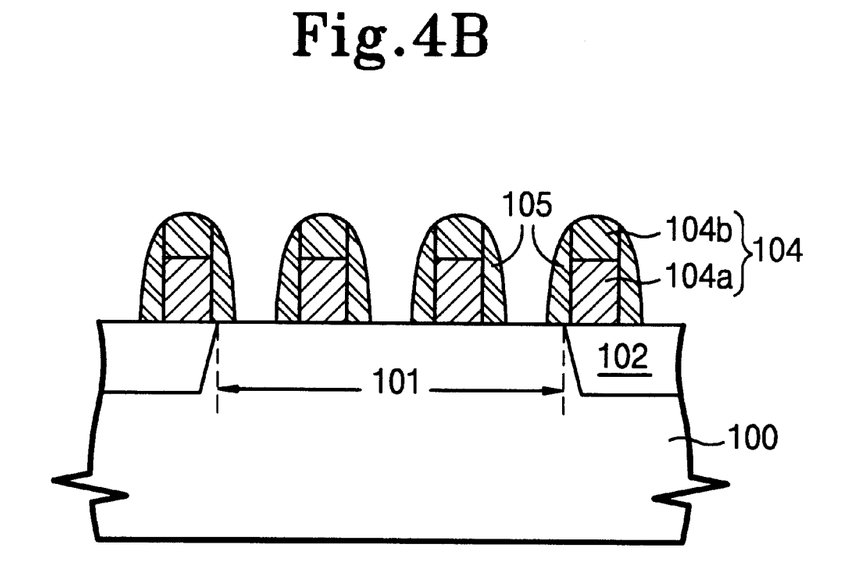

Referring to FIG. 3B and FIG. 4B, an insulating layer having a thickness of about 500 Å to about 1000 Å is deposited over substrate 100 and gate electrode structures 104. The insulating layer is then anisotropically etched to form gate spacers 105 on both of the lateral sidewalls of gate electrode structures 104. Gate spacer 105 has an etch selectivity ratio with respect to a subsequent interlayer dielectric layer 108. Gate spacer 105 may be composed of a material such as, but not limited to, silicon nitride and silicon oxynitride. Next, high concentration impurity ions are implanted into portions of active region 101 in semiconductor substrate 100 not covered by gate spacers 105 or gate electrode structures 104, forming high concentration source/drain regions. A transistor having an LDD structure is thereby formed.

Figure 3C:
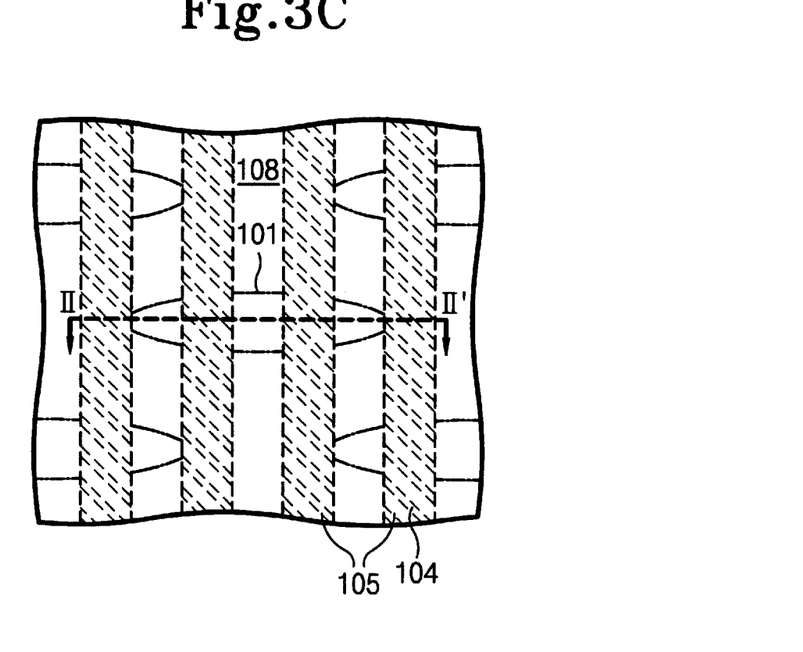
Figure 4C:
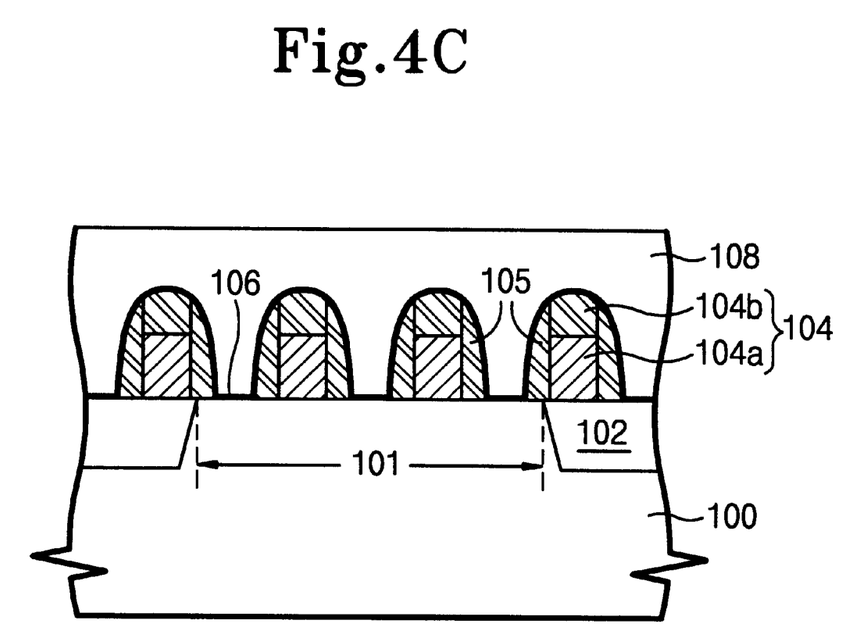

Referring to FIG. 3C and FIG. 4C, a thin etch stopping layer 106 having a thickness of about 100 Å is blanket deposited over the entire structure. Etch stopping layer 106 further protects against the subsequent self aligned contact etch and is made of a material that has an etch selectivity ratio to interlayer dielectric layer 108, such as, but not limited to silicon nitride and silicon oxynitride.

Interlayer dielectric layer 108 is then deposited over etch stopping layer 106 to a thickness of about 3000 Å to about 9000 Å, or thick enough to cover the transistors. The process that forms interlayer dielectric layer 108 allows a material to be deposited conformally which in turn allows a complete fill of contact holes without void formation and may be, for example, high density plasma (HDP) chemical vapor deposition (CVD). Interlayer dielectric layer 108 is then planarized to improve photolithography process margin. The planarization process may be a CMP (chemical mechanical polishing) or etch back process or a combination thereof, and is performed until interlayer dielectric layer 108 has a thickness of about 500 Å to about 1000 Å above the top surface of the transistor, i.e., above gate mask 104b.

Alternatively, the planarization may expose the top surface of gate mask 104b, and another interlayer dielectric layer having a predetermined thickness, typically about 500 Å to about 1000 Å, is deposited over gate mask 104b.

Figure 3D:
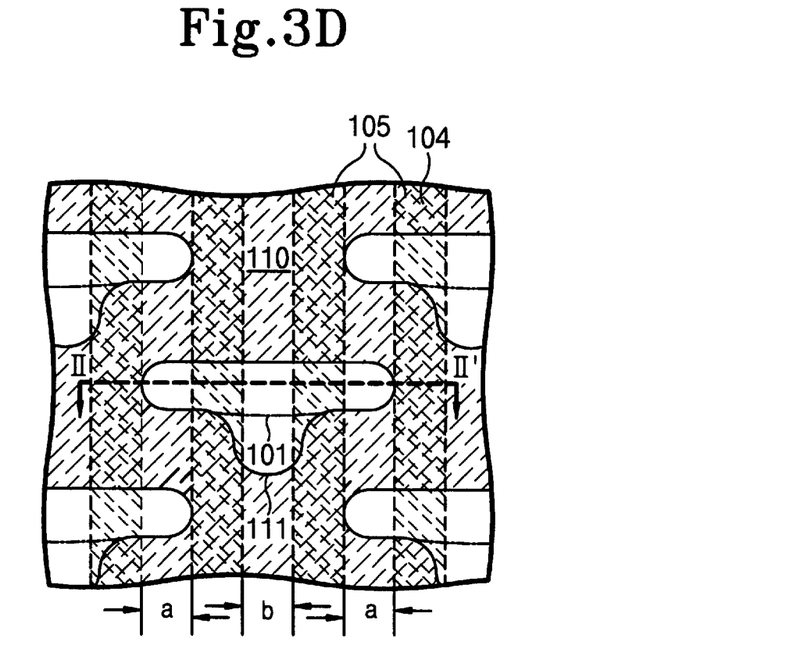
Figure 4D:
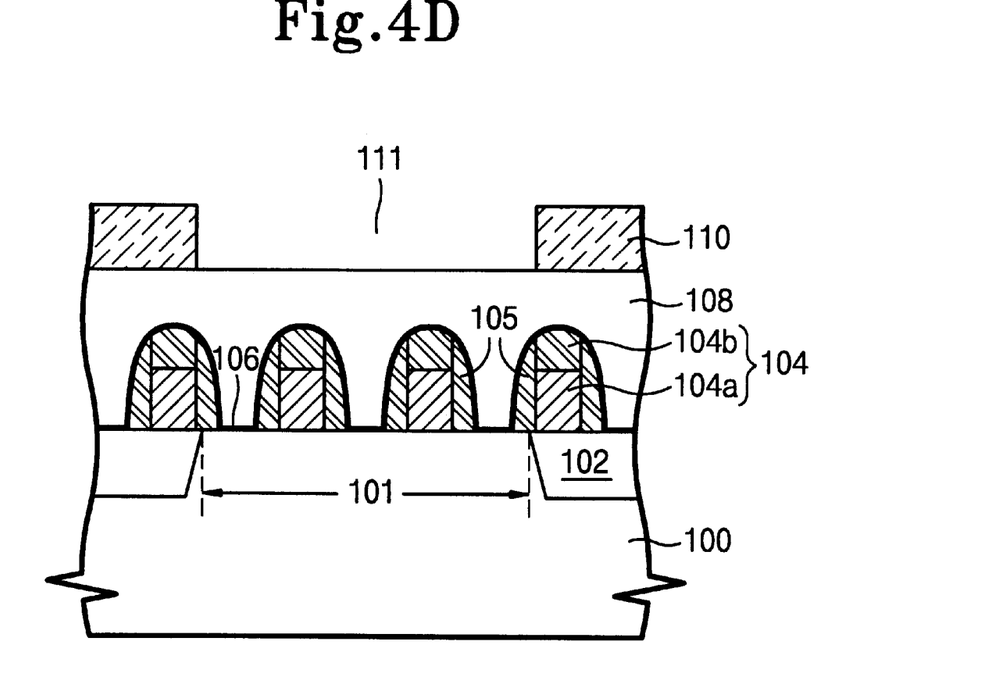

Referring to FIG. 3D and FIG. 4D, a mask pattern 110, preferably made of a photoresist is formed over planarized interlayer dielectric layer 108 or the re-deposited interlayer dielectric layer. Mask pattern 110 has a T-shaped opening 111 overlying active region 101 and a portion of the inactive region. Specifically, T-shaped opening 111 has a portion that crosses over adjacent gate electrode structures 105 and overlies storage node contact regions "a" and an a portion that is parallel and between gate electrode structures 105 and overlies a bit line contact region "b." The etch stop phenomenon encountered in the prior art (which has circular or elliptical openings) is eliminated because T-shaped openings 111 in mask pattern 110 are relatively large and better allow removal of etching by-products when compared to the openings conventionally used. Yet, T-shaped openings 111 are relatively small and provide good etch selectivity when compared with the openings Y. Kohyama et al. suggests.

Figure 3E:
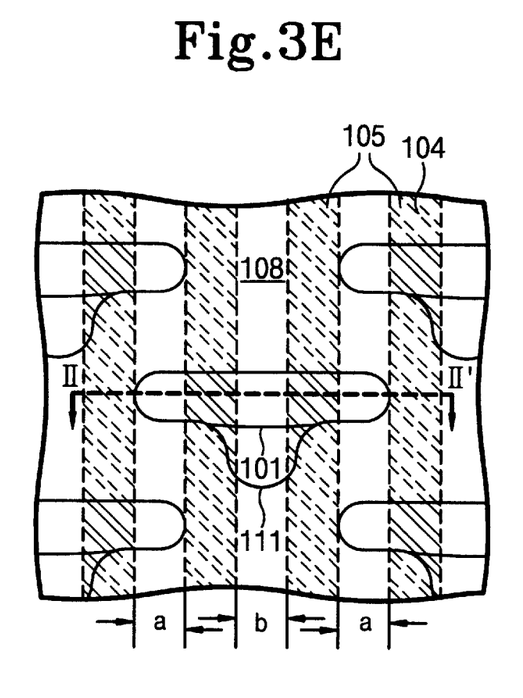
Figure 4E:
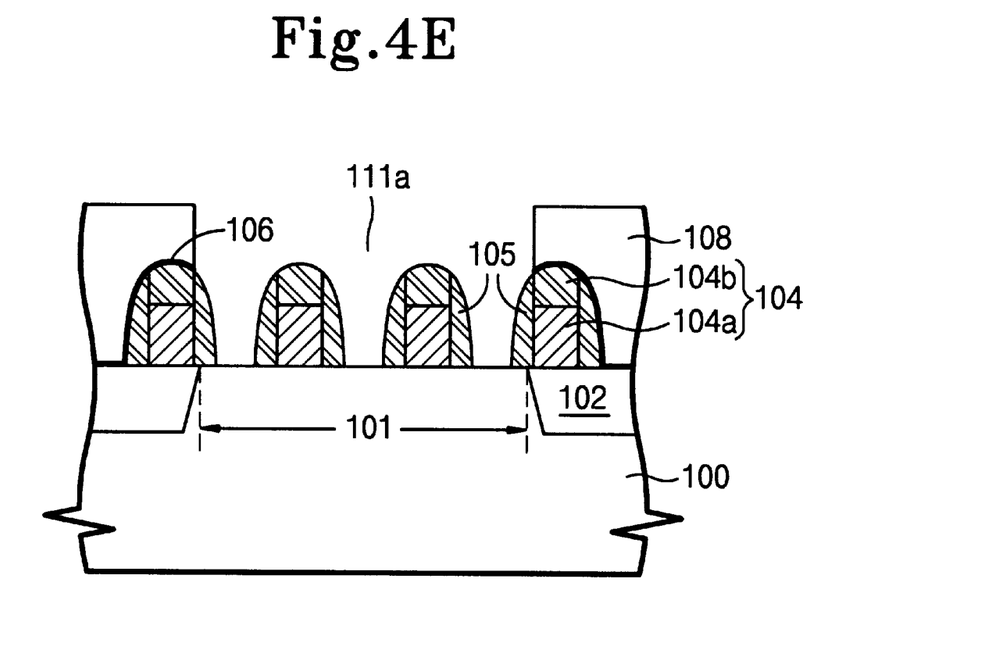

In FIG. 3E and FIG. 4E, interlayer dielectric layer 108 is etched using pattern 110 as a mask. Self aligned contacts are exposed by selectively etching interlayer dielectric layer 108 with respect to gate mask 104b, sidewall gate spacer 105 and etch stopping layer 106. Etch stopping layer 106 between the transistors is then removed to form a self aligned contact opening 11a which exposes semiconductor substrate 100 between the transistors, i.e., exposes portions of bit line contact region "b" and storage node, contact region "a."

Figure 3F:
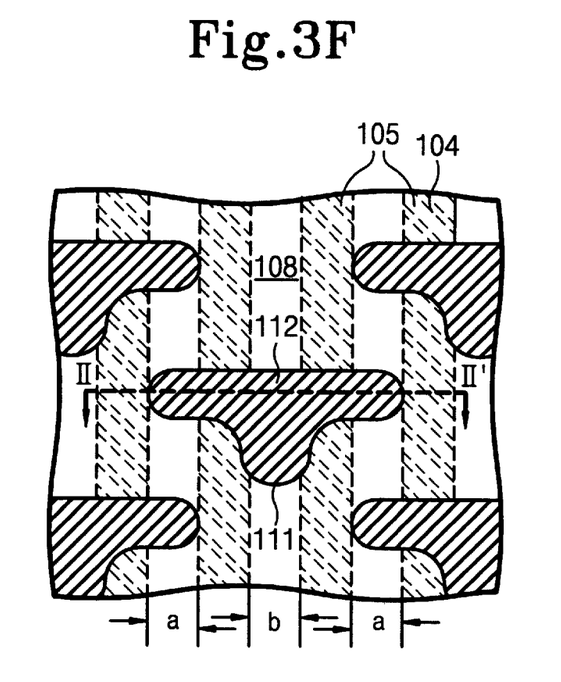
Figure 4F:
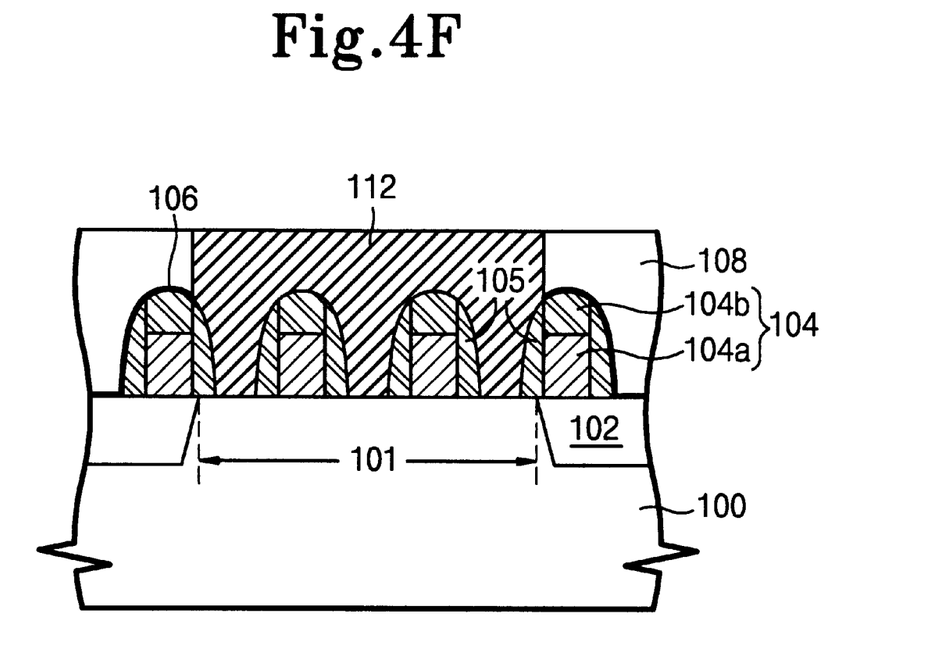

After removing mask pattern 110, a conductive layer 112 having a thickness of about 3000 Å to about 7000 Å is deposited in self aligned contact opening 111a and over interlayer dielectric layer 108. Conductive layer 112 is then planarized using a conventional planarization process such as a CMP or etch-back process until the top surface of interlayer dielectric layer 108 is exposed, as shown in FIG. 3F and FIG. 4F. If CMP is chosen, a slurry for polysilicon layer etching is used.

Figure 3G:
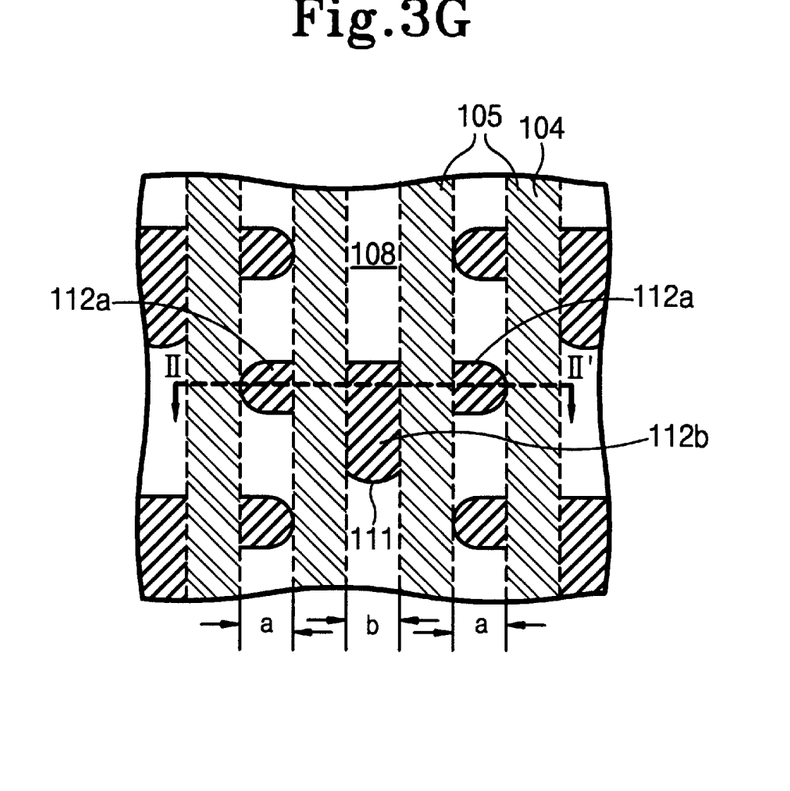
Figure 4G:
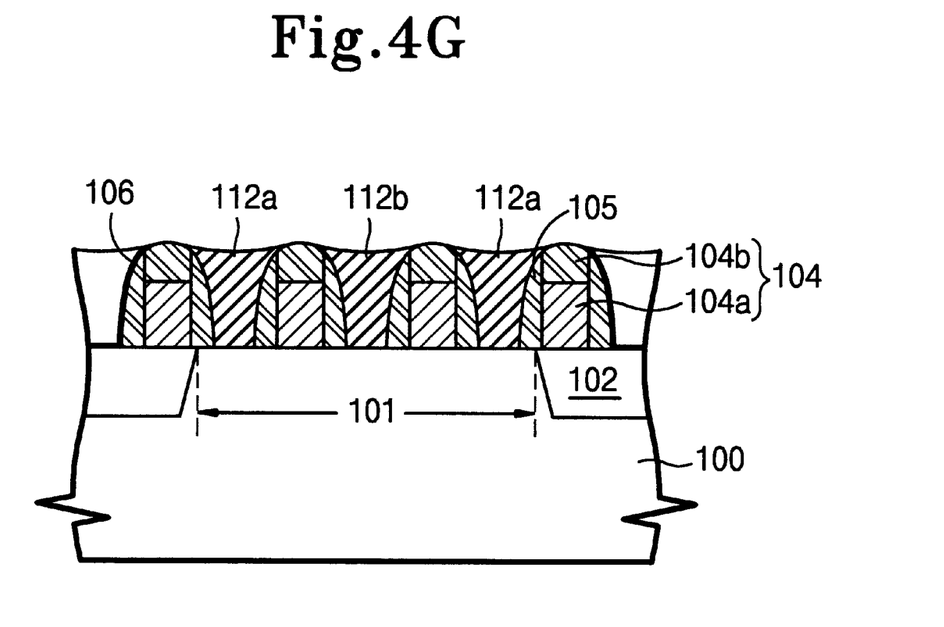

Finally, interlayer dielectric layer 108 and polysilicon layer 112 are planarized by CMP to form self aligned bit line contact pad 112b and storage node contact pad 112a, as shown in FIG. 3G and FIG. 4G. This CMP uses a slurry for oxide layer etching.

During the etching to form self aligned contact opening 111a, gate mask 104b may be lost. Thus, poly stringer formation may occur. A wet etch or a dry etch may be performed on the top surface of contact pads 112a and 112b to remove the poly stringer and prevents a bridge between bit line contact pad 112b and storage node contact pad 112a. Wet etch may use SC1 (a mixture of $NH_3$, $H_2O_2$, and deionized water) and dry etch may use chlorine-based gas.

In the case where forming self aligned contact opening 111a is immediately after the planarization process which planarizes down to the top surface of gate mask 104b, about 500 Å to about 900 Å of gate mask 104b is etched. This causes a step between the transistors. The step makes removing the poly stringer difficult during wet or dry etching of contact pads 112a and 112b.

However, according to the present invention, the planarization process is performed such that interlayer dielectric layer 108 has a thickness of about 500 Å to about 1000 Å over the top surface of gate mask 104b. Even if the planarization process is performed down to the top surface of gate mask 104b, another interlayer dielectric layer formed thereon has a thickness of about 500 Å to about 1000 Å. Hence, in accordance with the present invention, only a small amount, e.g., 200 Å of gate mask 104b, is removed when forming self aligned contact opening 111a. Accordingly, contact pads with good characteristics may be obtained without poly stringers.

FIG. 5A to FIG. 5E are cross-sectional views illustrating a processing for forming self aligned contacts according to another embodiment of the present invention.

Figure 5A:
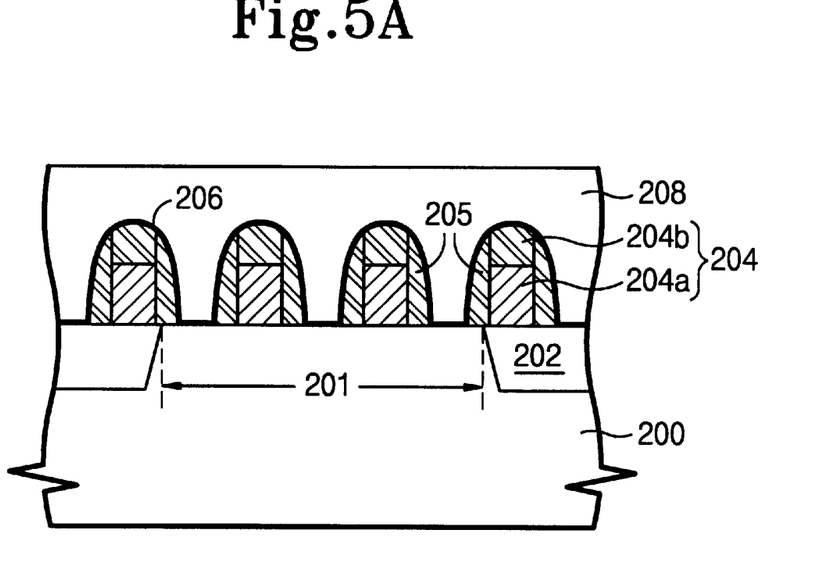
FIG. 5A to FIG. 5E are cross-sectional views illustrating a process for forming a self aligned contact according to another embodiment of the present invention.

Referring to FIG. 5A, a device isolation region 202 is formed in a predetermined region of a semiconductor substrate 200, e.g., to define an active region 201 and an inactive region. Device isolation region 202 may be formed by a suitable method well known in the art such as, but not limited to, shallow trench isolation (STI) and local oxidation of silicon (LOCOS). Active region 201 has an elliptical shape.

A gate oxide layer (not shown) is then formed over semiconductor substrate 200 using a conventional method. Next, a gate electrode conductive layer and a gate mask insulating layer are deposited over the gate oxide layer,. The gate electrode conductive layer is generally, but not limited to a polysilicon layer or laminated with polysilicon and silicide layers and has a thickness of about 2000 Å. The gate mask layer contains a material having an etch selectivity ratio to a subsequent interlayer dielectric layer 208. For example, the gate mask layer is composed of a silicon nitride layer or a silicon oxynitride layer having a thickness of about 1000 Å to about 2000 Å.

A photolithography method well known in the art is conducted on the electrode conductive layer and the gate mask layer to form gate electrode structure lines 204. Each gate electrode structure line 204 consists of a gate mask layer 204b and a gate electrode 204a. A pass gate is formed to have a curved part along the edge of active region 201 to allow more the space between the gates. The increased space between the gates increases the process margin of the self aligned contact etch and decreases the possibility of the contact not being exposed through the self aligned contact opening created by a subsequent etching step.

Next, low concentration impurity ions are implanted into active region 201 in semiconductor substrate 200 not covered by gate electrode structures 204 to form a low concentration source/drain region for an LDD (lightly doped drain) structure.

An insulating layer having a thickness of about 500 Å to about 1000 Å is deposited over substrate 200 and gate electrode structures 204. The insulating layer is then etched back to form gate spacers 205 on both of the lateral sidewalls of gate electrode structures 204. Gate spacers 205 have an etch selectivity ratio with respect to a subsequent interlayer dielectric layer 208. Gate spacers 205 are composed of a material such as, but not limited to, silicon nitride and silicon oxynitride. Next, high concentration impurity ions are implanted into active region 201 in semiconductor substrate 200 not covered by gate electrode structure 204 or gate spacers 205, thereby forming high concentration source/drain regions for transistors having LDD structures.

A thin etch stopping layer 206 having a thickness of about 100 Å is blanket deposited over the entire structure. Etch stopping layer 206 protects against the subsequent self aligned contact etch and is made of a material that has an etch selectivity ratio to the interlayer dielectric layer 208 such as, but not limited to silicon nitride and silicon oxynitride.

Interlayer dielectric layer 208 is then deposited over etch stopping layer 206 to a thickness about 3000 Å to about 9000 Å, or thick enough to cover the transistors. Interlayer dielectric layer 208 is formed using a process that allows a material to be deposited conformally which in turn allows a complete fill of contact holes without void formation. For example, a high density plasma (HDP) chemical vapor deposition (CVD) can form dielectric layer 208. Interlayer dielectric layer 208 is then planarized to improve photolithography process margins. The planarization process may be a CMP (chemical mechanical polishing) or etch back process or a combination thereof and thins interlayer dielectric layer 208 to a thickness of about 500 Å to about 1000 Å from the top surface of the transistor, i.e., from gate mask 204b. Alternatively, the planarization exposes the top surface of gate mask 204b, and another interlayer dielectric layer having a predetermined thickness, typically about 500 Å to about 1000 Å, is deposited over gate mask 204b.

Figure 5B:
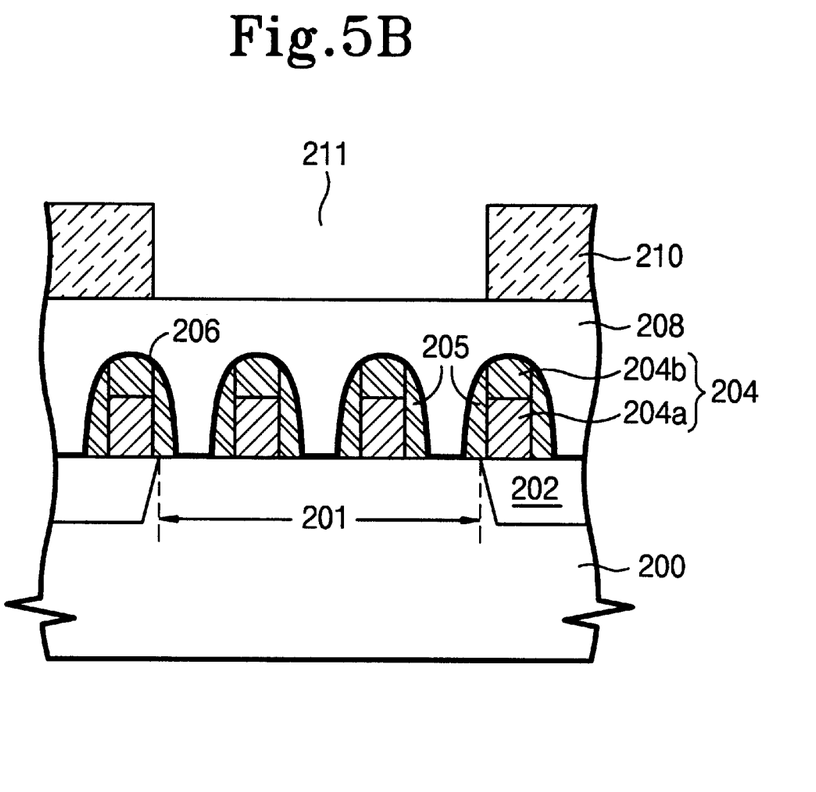

Referring to FIG. 5B, a mask pattern 210, preferably made of a photoresist is formed over planarized interlayer dielectric layer 208 or the re-deposited interlayer dielectric layer. Pattern 210 has a T-shaped opening 211 which exposes active region 201 and a portion of the inactive region. Specifically, T-shaped opening 211 exposes both bit line contact region "b" and storage node contact region "a."

Accordingly, the etch stop phenomenon encountered in the prior art methods (which have circular or elliptical openings) is eliminated because T-shaped openings 211 in mask pattern 210 are relatively large. Yet, T-shaped openings 211 are relatively small compared with the openings of Y. Kohyama et al., so that the etch selectivity for the self aligned contact is good.

Figure 5C:
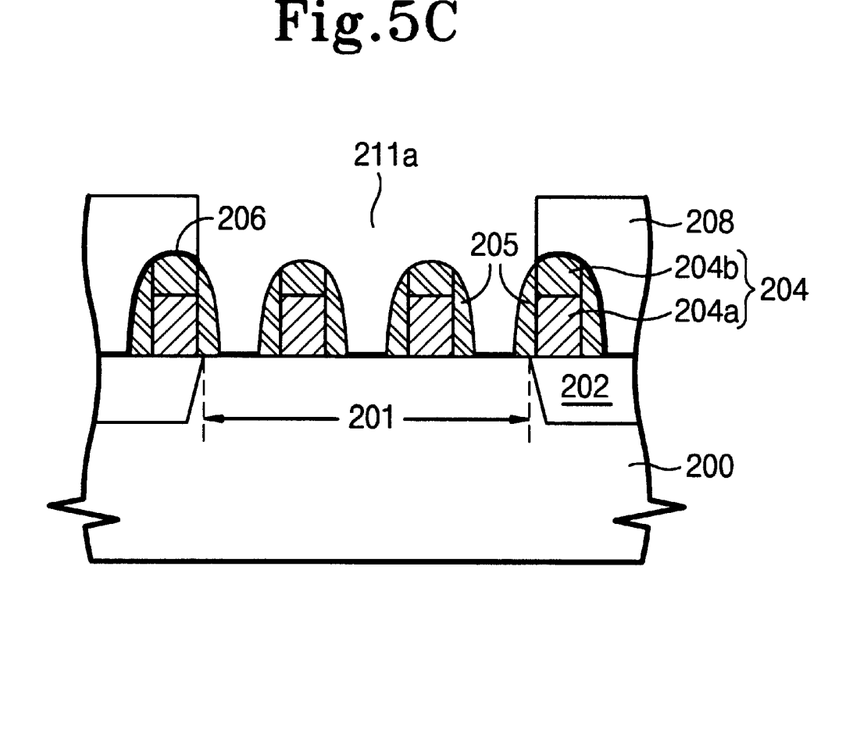

Referring to FIG. 5C, interlayer dielectric layer 208 is etched using pattern 210 as a mask. Self aligned contacts are exposed by selectively etching interlayer dielectric layer 208 with respect to gate mask 204b, sidewall gate spacer 205 and etch stopping layer 206. During this etching, the top surface of the transistor, i.e., gate mask 204b, may be etched because of the step between the top surface of the transistor and the bottom portion adjacent to the transistor. Accordingly, a larger amount of insulating layer 206 is etched on the top portion of the transistor than the bottom portion adjacent to the transistor. This may result in difference in the transistor height, making planarization of the subsequent conductive layer difficult.

Figure 5D:
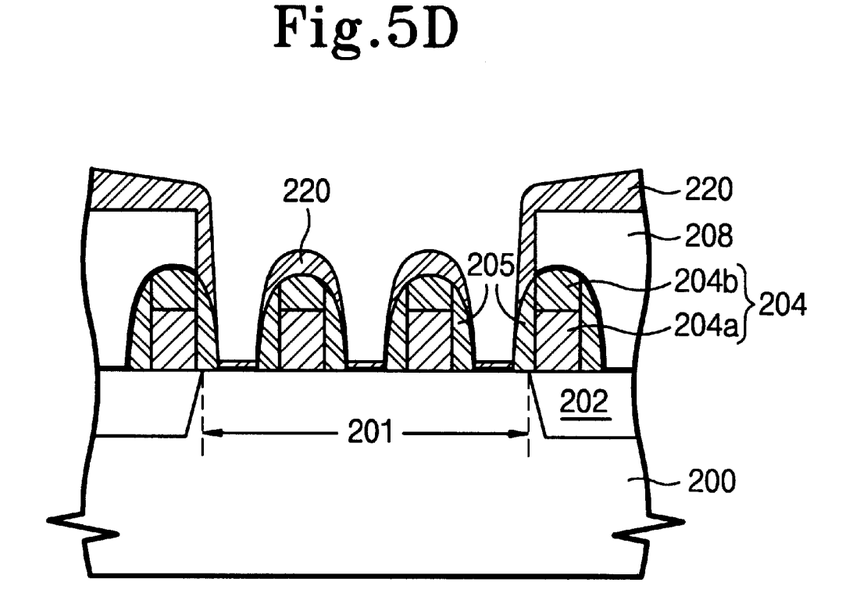

A compensation mask layer 220 is deposited over the resulting structure to compensate the loss of gate mask 204b, as shown in FIG. 5D. Because more of insulating layer 206 is etched on the top portion of the transistor than the bottom portion adjacent to the transistor, compensation mask layer 220 is deposited such that a more material deposits on the top portion of the transistor and interlayer dielectric layer 208 than in space between to the gate structures. Compensation mask layer 220 may be composed of, but is not limited to, silicon nitride or silicon oxynitride that is deposited by, e.g., plasma enhanced chemical vapor deposition. Compensation mask 220 has a thickness of about 200 Å to about 1500 Å.

Figure 5E:
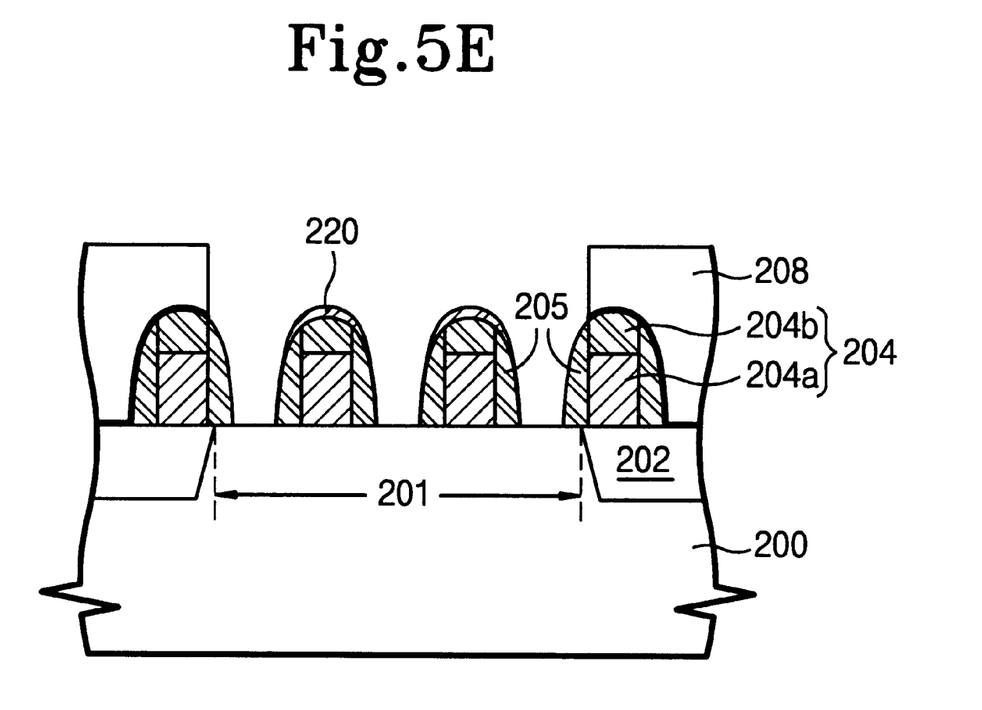

Referring to FIG. 5E, etch stopping layer 206 and compensation mask layer 220 are removed by, for example, an etch back process to expose portions of bit line contact region "a" and storage node contact region "b" between the transistors.

The remaining process sequences are the same as those illustrated in FIG. 4F to FIG. 4G. Specifically, a conductive layer (not shown) having a thickness of about 3000 Å to about 7000 Å is deposited in self aligned contact openings 211a and over interlayer dielectric layer 208. The conductive layer is then planarized using a planarization process such as CMP or etch-back until the top surface of interlayer dielectric layer 208 is exposed. If CMP is chosen, slurry is used for polysilicon layer etching.

Finally, interlayer dielectric layer 208 and the polysilicon layer are planarized by CMP to form self aligned bit line contact pads and storage node contact pads. CMP uses a slurry for oxide layer etching.

In summary, the invention forms a device such as a DRAM cell where a bit line contact region and a storage node contact region are simultaneously exposed with the use of a photoresist layer pattern that has a T-shaped opening. By having a T-shaped opening, the etch stop phenomenon is eliminated and the etch selectivity of the interlayer dielectric layer to the gate mask and spacer is improved. Further, fully printable self aligned contact pads are formed with good reliability.

Although the invention has been described with reference to particular embodiments, the description is an example of the invention's application and should not be taken as a limitation. Various adaptations and combinations of the features of the embodiments disclosed are within the scope of the invention as defined by the following claims.

What is claimed is:

1. A method for forming a self aligned contact in a semiconductor device having a semiconductor substrate, a device isolation layer formed on said semiconductor substrate to define active and inactive regions, and a transistor formed on said active and inactive regions, said transistor comprising a gate electrode, a gate mask thereon, and a sidewall gate spacer, said method comprising:

forming an etch stopping layer over said semiconductor substrate and said transistor;

forming an interlayer dielectric layer over said etch stopping layer, said interlayer dielectric layer having a planar top surface;

forming a mask pattern over said interlayer dielectric layer, said mask pattern having a T-shaped opening exposing said active region and a portion of said inactive region;

sequentially etching said interlayer dielectric layer and etch stopping layer using said mask pattern, thereby forming a self aligned contact opening exposing a top surface of said semiconductor substrate;

removing said mask pattern;

forming a conductive layer in said self aligned contact opening and over said interlayer dielectric layer; and planarizing said conductive layer and interlayer dielectric layer to reveal a top surface of said gate mask, thereby forming at least two contact pads.

2. The method according to claim 1, wherein each of said gate mask, sidewall gate spacer and etch stopping layer comprises an insulating material having an etch selectivity ratio to said interlayer dielectric layer.

3. The method according to claim 2, wherein said insulating material is a material selected from the group consisting of silicon nitride and silicon oxynitride.

4. The method according to claim 1, wherein said etch stopping layer comprises a material selected from the group consisting of silicon nitride and silicon oxynitride.

5. The method according to claim 1, wherein said gate mask has a thickness in the range of about 1000 Å to about 2000 Å, said sidewall gate spacer has a thickness in the range of about 500 Å to about 1000 Å, and said etch stopping layer has a thickness of about 100 Å.

6. The method according to claim 1, wherein each of said gate mask, sidewall gate spacer and etch stopping layer serves as an etch stopping layer during said etching interlayer dielectric layer.

7. The method according to claim 1, wherein said interlayer dielectric layer has a thickness in the range of about 3000 Å to about 9000 Å, and said conductive layer has a thickness in the range of about 3000 Å to about 7000 Å.

8. The method according to claim 1, wherein said T-shaped opening is a merged contact region including at least two contact regions.

9. The method according to claim 1, wherein said planarizing is performed by a process selected from the group consisting of a CMP process, an etch-back process, and a combination thereof.

10. The method according to claim 1, further comprises etching a top surface portion of said contact pads subsequent to said planarizing.

11. The method according to claim 10, wherein said etching the top surface portion of said contact pads is performed by a process selected from the group consisting of a wet etch process and a dry etch process, and said etching the top surface portion of said contact pads removes a conductive stringer between said contact pads.

12. The method according to claim 1, wherein forming the interlayer dielectric layer comprises:

forming a first dielectric layer over said etch stopping layer;

planarizing said first dielectric layer until a top surface of said gate mask is exposed; and forming a second dielectric layer over said first interlayer dielectric layer.

13. The method according to claim 12, further comprises etching a top surface portion of said contact pads subsequent to said planarization-etching said conductive layer and second interlayer dielectric layer.

14. The method according to claim 13, wherein said etching a top surface portion of said contact pads is performed by a process selected from the group consisting of wet etch process and dry etch process, said etching a top surface portion of said contact pads removes a conductive stringer between said contact pads.

15. A method for forming a self aligned contact in a semiconductor device comprising a semiconductor substrate, a plurality of conductive structures formed on said semiconductor substrate, and a capping layer coating each of said conductive structures, said method comprising:

forming an interlayer dielectric layer over said semiconductor substrate and said conductive structures;

forming a mask pattern over said interlayer dielectric layer, said mask pattern having a T-shaped opening overlying at least two contact regions having one of the conductive structures therebetween; and etching said interlayer dielectric layer using said mask pattern, thereby forming self aligned contact openings to the contact regions.

16. The method according to claim 15, further comprising:

removing said mask pattern;

forming a conductive layer in said first and second self aligned contact openings and over said interlayer dielectric layer; and planarizing said conductive layer and interlayer dielectric layer to reveal a top surface of said capping layer, thereby forming at separate contact pads residing in self-aligned contact openings.

17. The method according to claim 16, further comprises etching a top surface portion of said contact pads subsequent to said planarizing said conductive layer and interlayer dielectric layer.

18. The method according to claim 17, wherein said etching a top surface portion of said contact pads is performed by a process selected from the group consisting of wet etch process and dry etch process, said etching a top surface portion of said contact pads removes a conductive stringer between said contact pads.

19. The method according to claim 15, wherein said separated contact regions are in an active region of said substrate; and said T-shaped opening comprises:
a first portion overlying said contact regions; and
a second portion perpendicular to said first portion and extending over an inactive region of said substrate.

20. The method according to claim 19, further comprising a third contact regions, wherein the T-shaped opening also overlies the third contact region.

21. The method according to claim 19, wherein:

said conductive structures comprise parallel gate lines;

said first portion of said T-shaped opening crosses at least one gate line; and said second portion of said T-shaped opening extends parallel to said gate lines.

22. A method for forming a self aligned contact in a semiconductor device having a semiconductor substrate, a device isolation layer formed on said semiconductor substrate to define active and inactive regions, and a transistor formed on said active and inactive regions, said transistor comprises a gate electrode, a gate mask thereon, and a sidewall gate spacer, said method comprising:

forming an etch stopping layer over said semiconductor substrate and said transistor;

forming an interlayer dielectric layer over said etch stopping layer, said interlayer dielectric layer having a planar top surface;

forming a mask pattern over said interlayer dielectric layer, said mask pattern having a T-shaped opening exposing said active region and a portion of said inactive region;

etching said interlayer dielectric layer using said mask pattern to reveal a top surface of said etch stopping layer between said transistor and adjacent transistors;

removing said mask pattern;

forming a compensation mask layer over said transistor and said interlayer dielectric layer, a larger amount of said compensation mask layer being deposited on a top portion of said transistor and said interlayer dielectric layer than a bottom portion adjacent to said transistor; and etching said compensation mask layer and said etch stopping layer to reveal a top surface of said semiconductor substrate adjacent to said transistor, thereby forming a self aligned contact opening.

23. The method according to claim 22, wherein each of said gate mask, sidewall gate spacer, and etch stopping layer comprises an insulating material having an etch selectivity ratio to said interlayer dielectric layer.

24. The method according to claim 23, wherein said insulating material is a material selected from the group consisting of silicon nitride and silicon oxynitride.

25. The method according to claim 22, wherein each of said gate mask, the gate spacer, and etch stopping layer serves as an etch stop during said etching said interlayer dielectric layer.

26. The method according to claim 22, wherein said T-shaped opening comprises a merged contact region including at least two contact regions.

27. The method according to claim 22, wherein said compensation mask layer comprises a material selected from the group consisting of silicon nitride and silicon oxynitride.

28. The method according to claim 22, wherein said compensation mask layer is formed by a deposition method that provides a poor step coverage, said deposition method comprising a PECVD method.

29. The method according to claim 22, wherein said compensation mask layer has a thickness in the range of about 200 Å to about 1500 Å.

30. The method according to claim 22, further comprising:

forming a conductive layer in said self aligned contact opening and over said interlayer dielectric layer subsequent to said etching said compensation mask layer and said etch stopping layer; and planarization-etching said conductive layer and interlayer insulating layer to reveal a top surface of said compensation mask layer, thereby forming at least two contact pads.

* * * * *